(12) United States Patent
Han et al.

(10) Patent No.: US 6,449,156 B1
(45) Date of Patent: Sep. 10, 2002

(54) HEAT SINK PROVIDED WITH COUPLING MEANS, MEMORY MODULE ATTACHED WITH THE HEAT SINK AND MANUFACTURING METHOD THEREOF

(75) Inventors: Seong-Chan Han, Chungcheongnam-do (KR); Dong-Woo Shin, Chungcheongnam-do (KR); Dong-Chun Lee, Chungcheongnam-do (KR); Wang-Jae Lee, Chungcheongnam-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/952,303

(22) Filed: Sep. 12, 2001

(30) Foreign Application Priority Data

Sep. 29, 2000 (KR) ........................................ 2000-57450

(51) Int. Cl.[7] ................................................. H05K 7/20
(52) U.S. Cl. ...................... 361/704; 165/80.3; 257/722; 257/719; 361/767; 361/715; 361/719
(58) Field of Search ............................... 165/80.2, 80.3, 165/185; 174/16.3; 24/457–458; 248/505, 510; 257/706–707, 712–713, 718–719, 722, 726–727; 361/688, 690, 703–704, 707, 709–715, 719–720, 737; 403/222, 265, 270

(56) References Cited

U.S. PATENT DOCUMENTS

| | | | | |
|---|---|---|---|---|
| 5,414,592 A | * | 5/1995 | Stout et al. ................... | 361/704 |
| 6,181,561 B1 | * | 1/2001 | Albrecht et al. ............. | 361/719 |
| 6,370,027 B1 | * | 4/2001 | Koizumi et al. ............. | 361/720 |
| 6,353,538 B1 | * | 3/2002 | Ali et al. ..................... | 257/719 |
| 6,377,460 B1 | * | 4/2002 | Pohl et al. ................. | 3611/704 |

* cited by examiner

Primary Examiner—Gregory Thompson
(74) Attorney, Agent, or Firm—Marger Jonhson & McCollom, P.C.

(57) ABSTRACT

A novel heat sink structure for being mounted to a module board to which semiconductor chips are attached and for dissipating or spreading heat generated from the semiconductor chips is disclosed. The heat sink comprises a heat sink base, and a coupling means for coupling the heat sink base to the module board. The coupling means passes through the heat sink base. The coupling means includes integrally formed upper and lower body portions, an orifice formed at least through the lower body portion, and a flanged base formed integral with the lower body portion. The flanged base fixes the coupling means to the heat sink base. The outer dimension of the upper body portion is smaller than the inner dimension of the lower body portion. As a result, many heat sinks can be stacked stably.

13 Claims, 7 Drawing Sheets

HEAT SINK PROVIDED WITH COUPLING MEANS, MEMORY MODULE ATTACHED WITH THE HEAT SINK AND MANUFACTURING METHOD THEREOF

BACKGROUND OF THE INVENTION

1. Field of the Invention

The invention relates generally to semiconductor chip assembly technology, and more particularly, to a heat sink for a memory module and a method of manufacturing the memory module with the heat sink.

2. Description of Related Art

In general, memory module devices have advantages in that more than two semiconductor memory chips are mounted onto a single circuit board to increase memory capacity. The memory modules also overcome many inconveniences associated with mounting several individual memory chips to the circuit board. In addition, the utility of obsolete memory chips can be enhanced through the memory module. Manufacturers employing surface mount technology for producing the memory module commonly use an array of printed circuit boards where several identical boards are continuously connected.

As the operational speed of individual semiconductor chips mounted on the board increases, more and more heat is produced from the chips and hence it is important to effectively dissipate the heat. In particular, Rambus DRAMs operating at even higher speed than normal DRAMs require special concern in dissipating the heat. For example, 64M Rambus DRAMs using a printed circuit board have maximum operating power of 2.0W to 2.1W. Thus, the thermal problem is an inevitable aspect of the device. To solve the thermal problem, a heat sink can be connected to the memory module. A conventional heat sink has a Thermal Interface Material (TIM) attached to one side of the heat sink, and is fastened to the memory module. The TIM is made of silicon rubber having good thermal conductivity to transfer heat generated from the chips to the heat sink.

In coupling the heat sink to the memory module, a fastener such as a push pin or bolt is generally used. However, when the heat sink is coupled to the memory module by the push pin or by the bolt, the coupling strength of the heat sink and the memory module is weak and the reliability of the module device is poor, while memory module manufacturers and end users such as a set maker can easily disassemble or remove the heat sink from the memory module.

Further, due to the structural nature of push pins and bolts, it is difficult for the heat sink producer to supply heat sinks coupled to the fastener in advance. In addition, even when the heat sinks coupled to the fastener are supplied to the memory module manufacturer, it is difficult to stack vertically and load individual heat sinks. Also, it is difficult to develop automatic production appliances for coupling the heat sink to the memory module.

On the other hand, according to current practices of memory module manufacturers, memory modules are assembled onto an array of printed circuit boards, dummy portions of the array are removed, and electrical functions of the memory modules are tested. However, in this process, it is difficult to couple the heat sink to the memory module. In addition, it is difficult to develop an automatic appliance for automatically coupling the heat sink and the memory module.

SUMMARY OF THE INVENTION

It is an object of this invention to provide memory modules having a structure such that the heat sinks are easily coupled to the memory modules, and a manufacturing method thereof.

It is another object of this invention to provide heat sinks having a structure adapted to the automatic production of memory modules coupled with heat sinks.

According to one aspect of this invention, a heat sink is attached to a module board on which a plurality of semiconductor chips are mounted, and dissipates or spreads heat generated from the chips. The heat sink includes a coupling means for coupling the heat sink to the module board and a hole through which the coupling means pierces. The coupling means includes integrally formed first and second body portions, a flanged base integrally formed with the second body portion. An orifice is formed at least through the second body portion. The flanged base may be fixed to one side of the module board and the first body is smaller than the second body.

According to another aspect of this invention, a method for manufacturing a memory module comprises: preparing an array of printed circuit boards; preparing an individual module board by cutting the array board; stacking a predetermined number of the individual module boards; preparing a heat sink; coupling a coupling means to the heat sink and attaching a thermal interface material to the heat sink; stacking a plurality of heat sinks with the coupling means and the thermal interface material; and coupling the stacked individual module boards and the stacked heat sinks one by one.

In one embodiment of this invention, a method for manufacturing a memory module comprises: preparing an array of module boards; providing individual module boards by cutting the array board; stacking the individual module boards by a predetermined number; preparing a first plurality of heat sinks; attaching thermal interface materials and installing coupling means to the first plurality of heat sinks; stacking the first plurality of heat sinks; preparing a second plurality of heat sinks; attaching thermal interface materials to the second plurality of heat sinks; stacking the second plurality of heat sinks; and coupling, one-by-one, the first and second plurality of heat sinks to the individual module boards by using the coupling means.

In accordance with one aspect of the present invention, a heat sink for being mounted to a module board to which semiconductor chips are attached and for dissipating or spreading heat generated from the semiconductor chips is disclosed. The heat sink comprises a heat sink base; and a coupling means for coupling the heat sink base to the module board. The coupling means passes through the heat sink base. The coupling means includes integrally formed upper and lower body portions, an orifice formed at least through the lower body portion, and a flanged base formed integral with the lower body portion, the flanged base fixing the coupling means to the heat sink base. An outer dimension of the upper body portion is smaller than an inner dimension of the lower body portion.

In accordance with another aspect of the present invention, a method for stacking heat sinks for fabrication of a memory module is disclosed. The method comprises preparing lower and upper heat sinks, the heat sink comprising:

- a heat sink base; and
- a coupling means for coupling the heat sink base to the module board, the coupling means passing through the heat sink base,
  wherein the coupling means includes upper and lower body portions, a shoulder joining the lower and upper body portions and tapering therebetween, an orifice formed at least through the lower body portion, and a flanged base formed integral with the lower body portion, the flanged base fixing the coupling means to the heat sink base, and wherein an outer dimension of the upper body portion is smaller than an inner dimension of the lower body portion. The method further includes stacking the upper heat sinks over the lower heat sink. The upper body portion of the coupling means of the lower heat sink is inserted into the orifice formed through the lower body portion of the coupling means of the upper heat sink, and the flanged base of the upper heat sink rests on the shoulder of the lower heat sink.

These and other features, and advantages, will be more clearly understood from the following detailed description taken in conjunction with the accompanying drawings. It is important to point out that the illustrations may not necessarily be drawn to scale, and that there may be other embodiments of this invention that are not specifically illustrated.

BRIEF DESCRIPTION OF THE INVENTION

FIG. 3b is a partially enlarged view of FIG. 3a.

DETAILED DESCRIPTION OF PREFERRED EMBODIMENTS

Figure 1A:
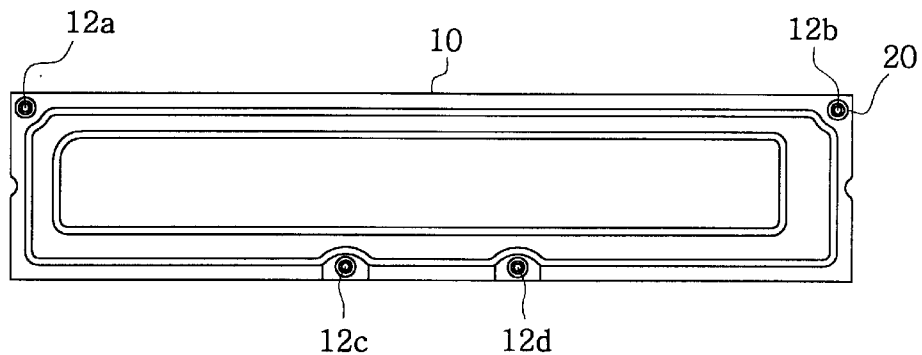
FIGS. 1a and 1b are a front view and a back view of a heat sink with a coupling means.
Figure 1B:
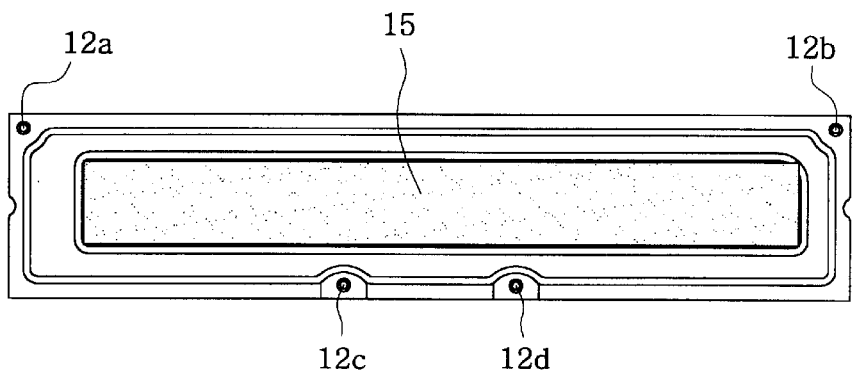

FIGS. 1a and 1b show a heat sink with a coupling means according to the present invention.

The heat sink 10 has in general a rectangular shape and four coupling holes 12a, 12b, 12c and 12d perforating the heat sink. The shape of the heat sink 10 and the number and position of the coupling holes are not necessarily limited to the structure shown in the drawings and depend on the module board to which the heat sink is to be coupled. The heat sink 10 is made of metal with high thermal conductivity such as aluminum. Coupling means 20 are coupled to each of the coupling holes 12.

The inside wall of the heat sink (i.e., the side facing the memory module) is attached to a Thermal Interface Material (TIM) 15 as shown in FIG. 1b. The TIM 15 is made of a silicon rubber that exhibits high thermal conductivity and conveys heat generated from semiconductor chips mounted on the module board to the heat sink. The TIM 15 is double-sided or one-sided adhesive.

Figure 2:
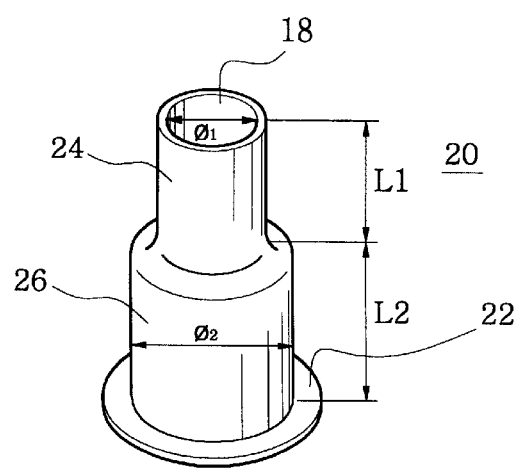
FIG. 2 is a perspective view of a coupling means according to an embodiment of the present invention.

FIG. 2 shows a preferred embodiment of coupling means of the present invention. The coupling means 20 shown is preferably an eyelet. The eyelet coupling means 20 is preferably made of brass metal or C2680 metal having improved elongation characteristics and tensile strength. The heat sink is subjected to a punching process when mounted on the module board. If the coupling means 20 is made of a metal such as aluminum having poor tensile strength and percentage of elongation, debris produced due to friction between the eyelet and a punch pin (not shown) deteriorates the coupling strength. The eyelet coupling means 20 may be plated with tin, tin-lead or nickel metal.

The coupling means 20 includes a clinched head 22, a first body 24 and a second body 26. An orifice or an opening 18 is formed to extend from the head 22 to the end of first body 24. A diameter of the first body 24 is preferably smaller than that of the second body 26. That is, the orifice 18 is smaller inside the first body than inside the second body. The reason for making different the dimensions of the first and the second bodies 24 and 26 of the orifice 18 is to apply the coupling means to automatic equipment for producing memory module devices by stacking a number of heat sinks.

The diameter D1 of the first body 24 and the diameter D2 of the second body 26 are suitably configured or modified for easily inserting the heat sink into a module board by automatic equipment in consideration of the size and the thickness of the memory module coupled with the heat sink. Further, the length L1 of the first body 24 and the length L2 of the second body are so selected that the coupling means 20 is not collapsed when the stacked heat sinks are fixed in the automatic equipment.

Figure 3A:
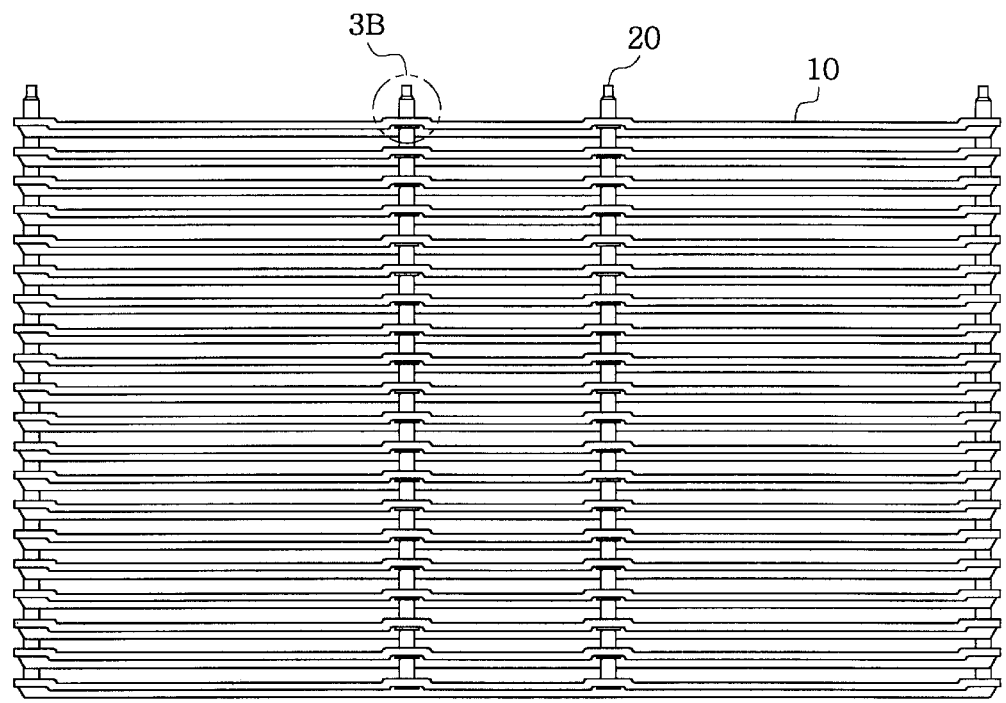
FIG. 3a shows a plurality of heat sinks stacked vertically.
Figure 3B:
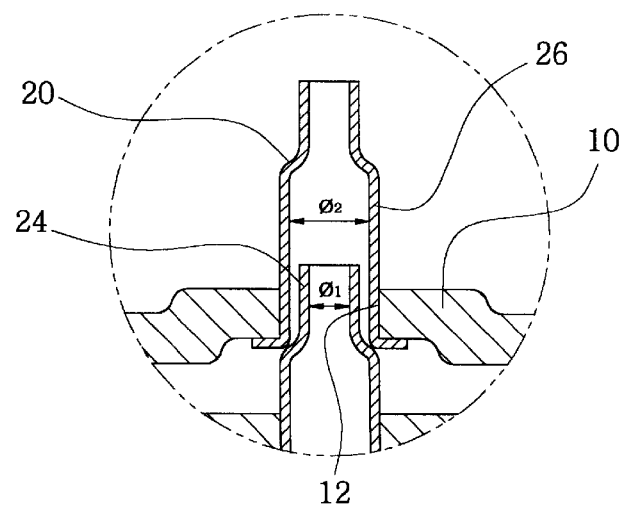

FIG. 3a shows a number of heat sinks stacked vertically. As explained above, since the diameter D1 of the first body 24 is smaller than the diameter D2 of the second body 26, in the stacked structure, the first body of the coupling means coupled to a lower heat sink, as shown in FIG. 3b, is inserted into the orifice penetrating the second body of the coupling means coupled to an upper heat sink. As a result, a plurality of heat sinks are stacked stably as shown in FIG. 3a. If heat sinks having a coupling means of identical body dimensions are to be vertically stacked, the stacking process is difficult and the stacked structure is unstable. Further, the stacked structure occupies increased space.

However, with the present invention, if memory module manufacturers are supplied with a predetermined number (e.g., twenty) of heat sinks, it is easy to apply the heat sink to an automatic appliance.

Figure 4:
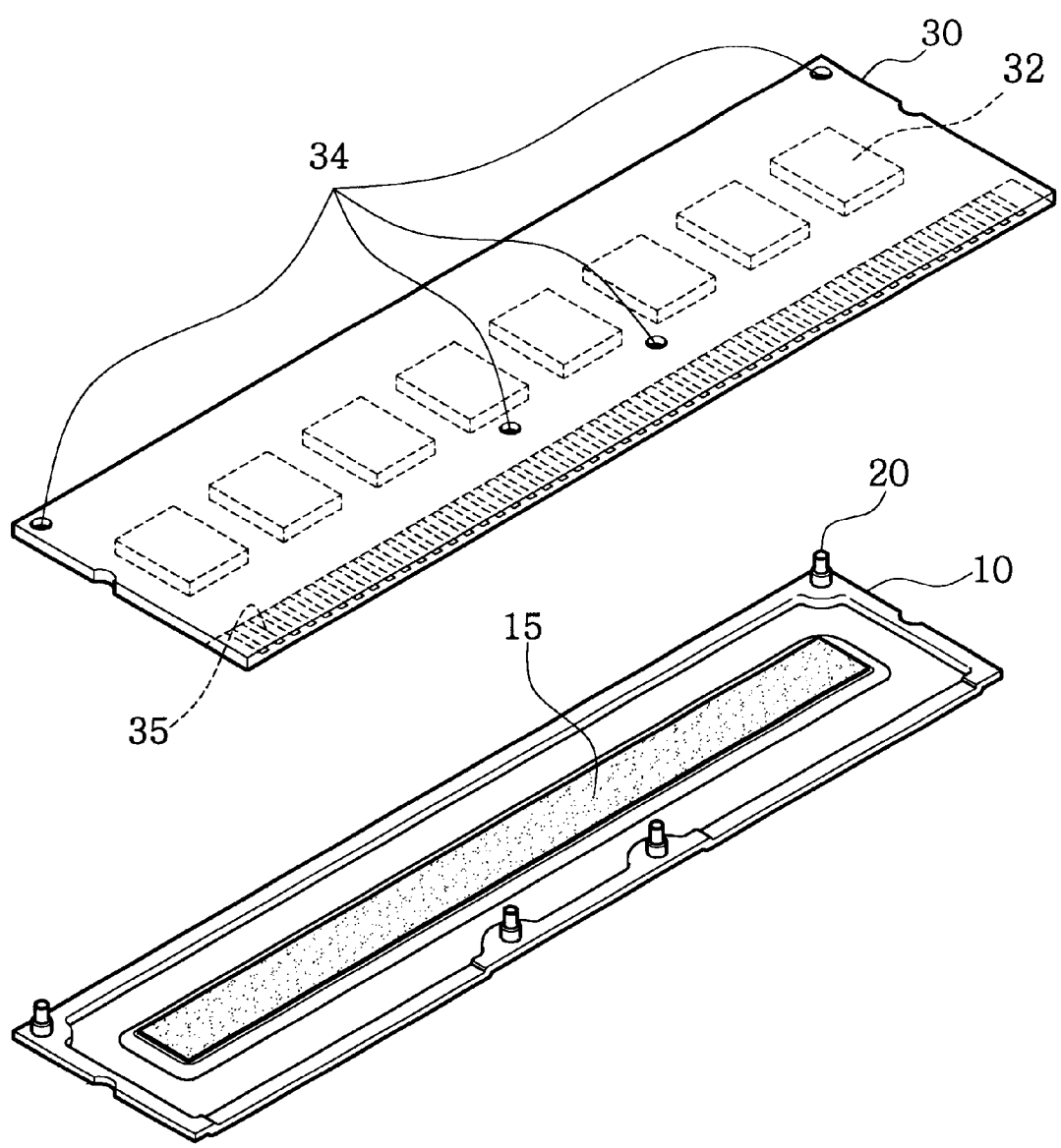
FIG. 4 is a perspective view showing a coupling relationship between a heat sink and a module board according to one embodiment of the present invention.

FIG. 4 is a perspective view showing the coupling relationship between a heat sink 10 and a memory module 30. In this embodiment, the heat sink 10 is coupled to a Rambus Inline Memory Module (RIMM) having memory semiconductor chips 32 attached to only one side of a memory module board 30. Through holes 34 to which each of coupling means 20 penetrate are formed in the module board 30, and a tab 35 for electrically connecting the module 30 to external devices such as a mother board or a main board is formed. End tip of the coupling means 20 penetrating the through holes 34 and protruding from the board are clinched and fixed to the board by a punch process.

Figure 5:
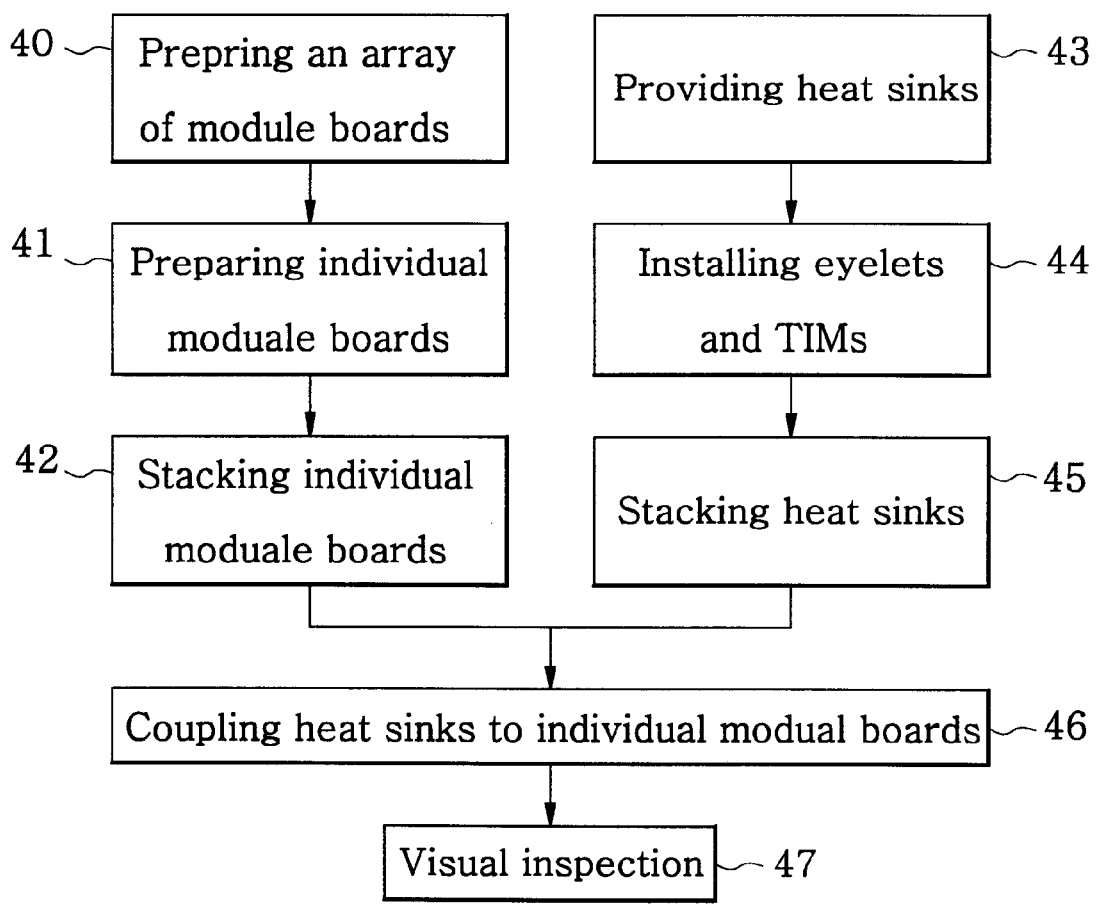
FIG. 5 illustrates the process flow of memory module-producing method according to one embodiment of the present invention.

FIG. 5 shows the process flow for manufacturing the RIMM module having memory chips mounted on only one side as shown in FIG. 4.

In step 40, an array of module boards is prepared. The array board is formed of several identical individual boards connected to each other. Each of the individual boards is connected by a dummy portion. By cutting the dummy portion, individual boards are prepared in step 41. The prepared individual boards are vertically stacked by a predetermined number in step 42.

In step 43, heat sinks are prepared. Four eyelets and a TIM are attached to each heat sink in step 44. The heat sinks, with attached eyelets and TIM, are then stacked vertically in step 45.

In step 46, each of the stacked heat sinks is coupled or locked to each of the stacked module boards one by one. Visual inspection is performed on the module device coupled with the heat sink in step 47.

It is preferable to include the preparation step of the individual module board when producing the memory module device, because when a heat sink is coupled to the array of the module board, mechanical pressure, e.g., punching pressure applied to the coupling means may cause a torsion in the array board and damage memory chips mounted to the board. In addition, when the heat sinks are coupled to the array board and the individual boards are prepared by cutting the array board, physical shock and vibration occurring in those processes may cause cracking in joints, e.g., solder joints between the chips and the board. Moreover, particles or dust produced during the cutting process remain on the board and cause failures of the chips and modules. It is, therefore, preferable to prepare the individual module boards and then couple the heat sinks to the individual module boards.

In addition, electrical testing and visual inspection are performed after the heat sinks are coupled to the module boards, for the reason that the semiconductor chips are exposed and vulnerable to damage when the chips are not covered by heat sinks coupled to the board. Accordingly, an electrical testing and a visual inspection are performed on the individual module devices. When the individual devices are determined defective in the electrical test, the reason for failure is analyzed. When defects are found in the visual inspection, the defective devices are subject to a reworking process. For the reworking process, the heat sinks have to be removed from the module board and consequently the coupling means need to be removed.

Figure 6:
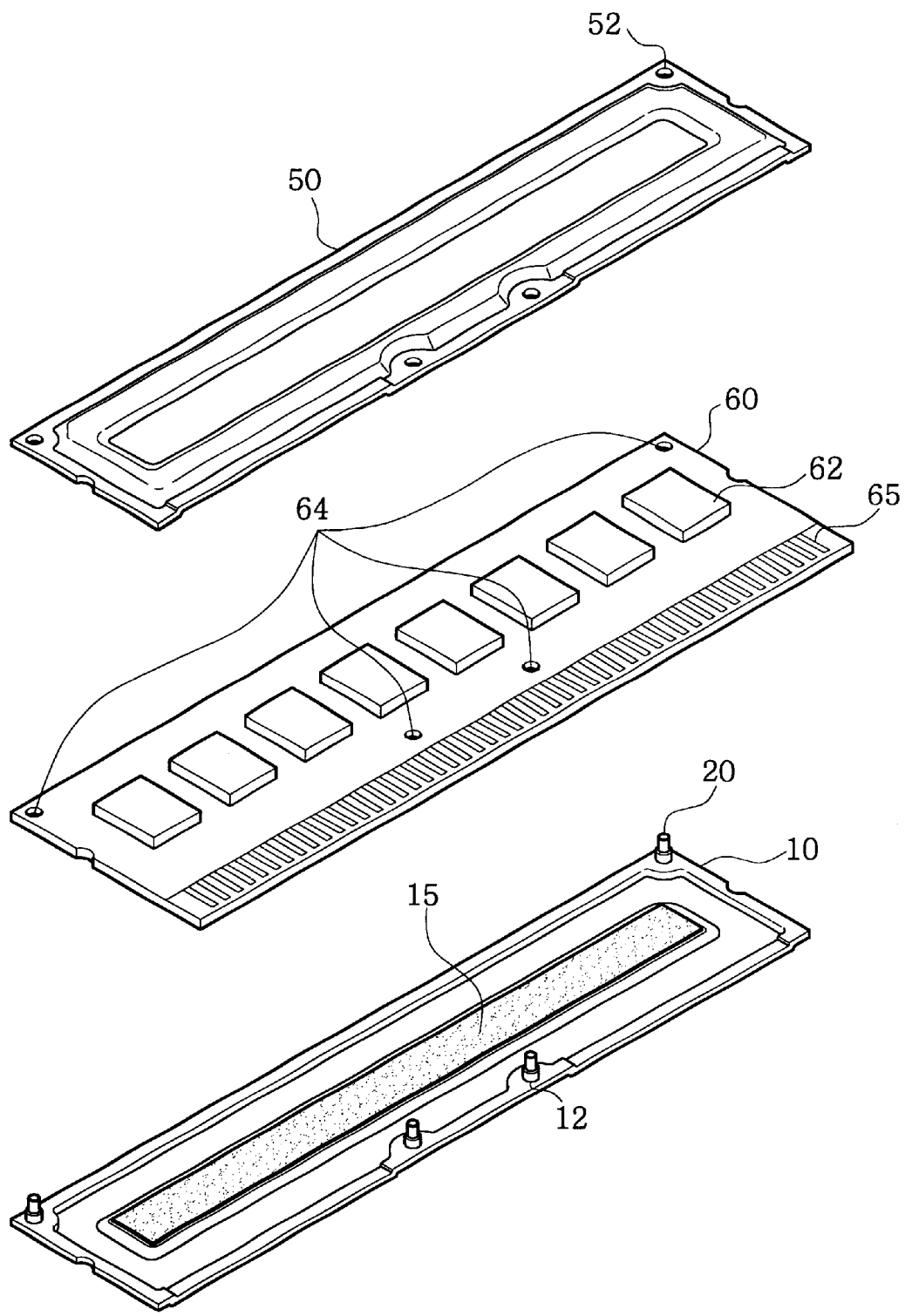
FIG. 6 is a perspective view showing a coupling relationship between heat sinks and a module board according to another embodiment of the present invention.

FIG. 6 is a perspective view for showing the coupling relationship between heat sinks and a memory module according to another embodiment of the present invention. In this embodiment, RIMM module devices having semiconductor memory chips 62 are mounted on both sides of a module board 60. Two heat sinks 10 and 50 are coupled to the module board 60 for the two-sided chips 62. However, coupling means are locked to only the first heat sink 10. To the second heat sink 50 are formed through holes 52 to which the coupling means 20 are inserted. Other through holes 64 are also formed in the module board 60. The module board 60 includes a tab 65 for electrically connecting the module board to an external device.

Figure 7:
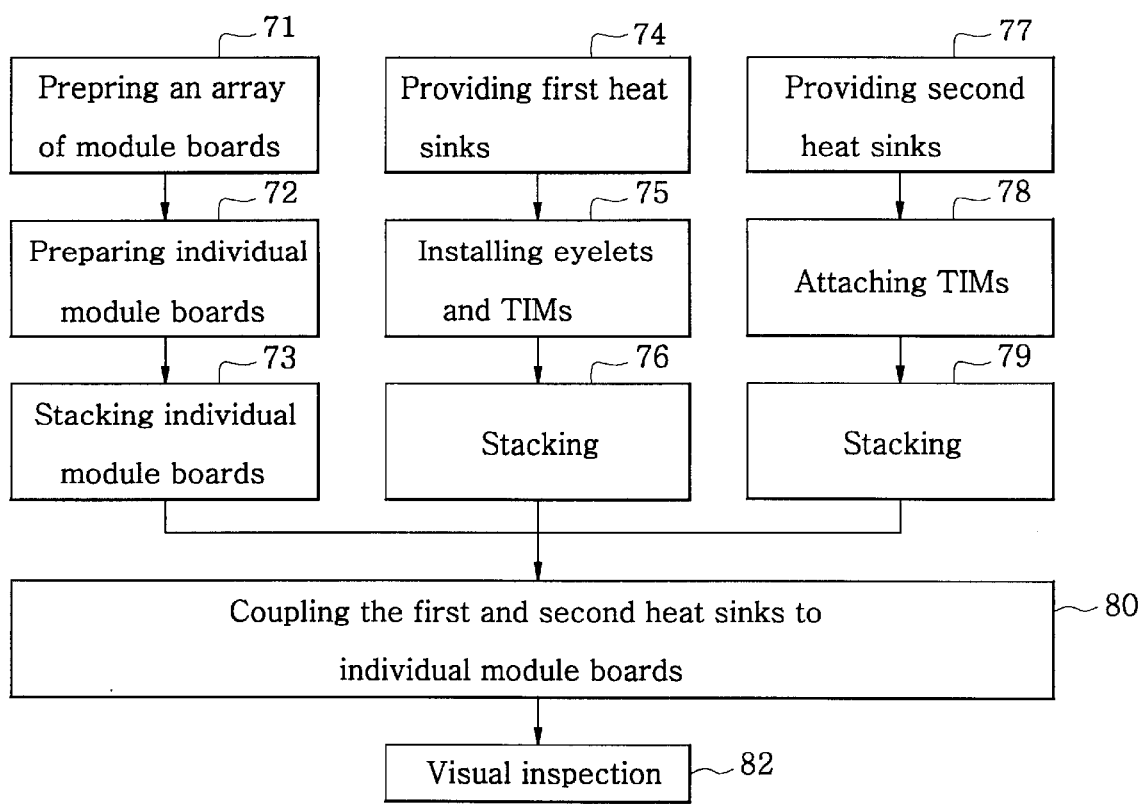
FIG. 7 illustrates the process flow of memory module-producing process according to another embodiment of the present invention.

FIG. 7 shows the process flow for producing a memory module device having heat sinks coupled to both sides of the board.

Referring to FIG. 7, an array board is prepared in step 71, and individual module boards are prepared by cutting the array board in step 72. The prepared individual boards are stacked in step 73.

In step 74, a first heat sink is prepared, and in step 75, eyelets and a TIM are attached to the first heat sink. A predetermined number of the first heat sinks, each of which is coupled with the eyelet coupling means are stacked vertically in step 76. In step 77, a second heat sink is prepared, and in step 78, a TIM is attached to the second heat sink. A predetermined number of the second heat sinks with attached TIM are stacked vertically in step 79.

The individual module board and the first and second heat sinks are coupled together by the eyelet coupling means in step 80. Then, an electrical test and a visual inspection are performed in step 82.

Figure 8:
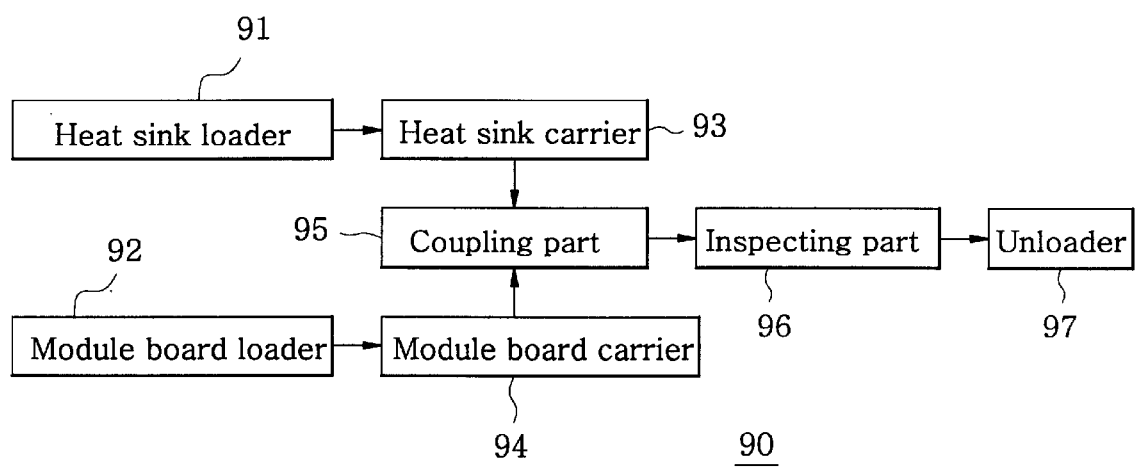
FIG. 8 is a schematic block diagram of an automatic apparatus suitable for use in manufacturing a memory module device.

FIG. 8 is a schematic block diagram of an exemplary automatic appliance suitable for use in the memory module manufacturing process of the present invention.

An apparatus 90 for manufacturing the memory module comprises a heat sink loader 91, a module board loader 92, a heat sink carrier 93, a module board carrier 94, a coupling part 95, an inspection part 96 and an unloader 97.

The heat sink loader 91 includes a loading portion (not shown) for vertically stacking to a predetermined height both heat sinks without eyelets and heat sinks having eyelets coupled. The module board loader 92 loads a predetermined number of modules contained in a tray. The heat sink carrier 93 conveys, one-by-one, heat sinks contained in the heat sink loader 91. The module board carrier 94 conveys, one-by-one, module boards contained in the module board loader 92. The coupling part 95 aligns the heat sinks conveyed by the carrier 93 and the module boards transferred by the carrier 94, and couples or locks the heat sink to the board by using eyelet coupling means coupled to the heat sink. The inspection part 96 checks the coupling state of the heat sink and the board. The unloader 97 sorts the module devices according the result of the inspection, and loads the sorted devices to corresponding trays.

As described herein, according to the present invention, a heat sink can be easily coupled to a module board, and it is possible to apply a memory module with a heat sink to an automatic appliance.

In the drawings and specification, there have been disclosed typical preferred embodiments of this invention and, although specific terms are employed, they are used in a generic and descriptive sense only and not for purposes of limitation, the scope of this invention being set forth in the following claims.

What is claimed is:

1. A heat sink for being mounted to a module board to which semiconductor chips are attached and for dissipating or spreading heat generated from the semiconductor chips, the heat sink comprising:

a heat sink base; and a coupling means for coupling the heat sink base to the module board, the coupling means passing through the heat sink base, wherein the coupling means includes integrally formed upper and lower body portions, an orifice formed at least through the lower body portion, and a flanged base formed integral with the lower body portion, the flanged base fixing the coupling means to the heat sink base, and wherein an outer dimension of the upper body portion is smaller than an inner dimension of the lower body portion.

2. A heat sink as claimed in claim 1, wherein a thermal interface material made of a silicon rubber is attached to the heat sink base.

3. A heat sink as claimed in claim 1, wherein the coupling means is made of brass metal.

4. A heat sink as claimed in claim 3, wherein a thermal interface material made of a silicon rubber is attached to the heat sink base.

5. In combination,
a heat sink for dissipating or spreading heat generated from semiconductor chips, the heat sink comprising:
  a heat sink base; and
  a coupling means for coupling the heat sink base to the module board, the coupling means passing through the heat sink base,
    wherein the coupling means includes integrally formed upper and lower body portions, an orifice formed at least through the lower body portion, and a flanged base formed integral with the lower body portion, the flanged base fixing the coupling means to the heat sink base, and
    wherein an outer dimension of the upper body portion is smaller than an inner dimension of the lower body portion; and
  a memory module board having holes formed therethrough,
  wherein the coupling means passing through the holes to couple the heat sink to the module board.

6. A combination as claimed in claim 5, wherein the semiconductor chips are mounted only on one side of the module board.

7. A combination as claimed in claim 6, wherein the coupling means is made of brass metal.

8. A combination as claimed in claim 6, wherein a thermal interface material made of a silicon rubber is attached to the heat sink.

9. A combination as claimed in claim 5, wherein the semiconductor chips are mounted on both sides of the module board.

10. A combination as claimed in claim 9, wherein the coupling means is made of brass metal.

11. A combination as claimed in claim 9, wherein a thermal interface material made of a silicon rubber is attached to the heat sink.

12. A method for manufacturing a memory module, comprising:
  preparing individual module boards with memory devices;
  preparing lower and upper heat sinks, wherein the heat sinks each comprise
    a heat sink base; and
    a coupling means for coupling the heat sink base to the individual module boards,
      the coupling means passing through the heat sink base,
      wherein the coupling means includes integrally formed upper and lower body portions, an orifice formed at least through the lower body portion, and a flanged base formed integral with the lower body portion, the flanged base fixing the coupling means to the heat sink base, and
      wherein an outer dimension of the upper body portion is smaller than an inner dimension of the lower body portion,
  stacking the lower and upper heat sinks,
    wherein the upper body portion of the coupling means of the lower heat sink is inserted into the orifice formed through the lower body portion of the coupling means of the upper heat sink; and
  coupling, one-by-one, the heat sinks to the individual module boards using the coupling means.

13. A method for stacking heat sinks for fabrication of a memory module, comprising:
  preparing lower and upper heat sinks, the heat sinks comprising:
    a heat sink base; and
    a coupling means for coupling the heat sink base to the module board, the coupling means passing through the heat sink base,
      wherein the coupling means includes upper and lower body portions, a shoulder joining the lower and upper body portions and tapering therebetween, an orifice formed at least through the lower body portion, and a flanged base formed integral with the lower body portion, the flanged base fixing the coupling means to the heat sink base, and
      wherein an outer dimension of the upper body portion is smaller than an inner dimension of the lower body portion,
  stacking the upper heat sinks over the lower heat sink,
    wherein the upper body portion of the coupling means of the lower heat sink is inserted into the orifice formed through the lower body portion of the coupling means of the upper heat sink, and
    wherein the flanged base of the upper heat sink rests on the shoulder of the lower heat sink.

* * * * *